US009957389B2

(12) United States Patent
Jung et al.

(10) Patent No.: US 9,957,389 B2
(45) Date of Patent: May 1, 2018

(54) THERMOSETTING RESIN COMPOSITION HAVING HEAT RESISTANCE AND LOW DIELECTRIC LOSS CHARACTERISTICS, PREPREG USING SAME, AND COPPER CLAD LAMINATE

(71) Applicant: DOOSAN CORPORATION, Seoul (KR)

(72) Inventors: Dong Hee Jung, Buyeo-gun (KR); Duk Sang Han, Daejeon (KR); Jeong Don Kwon, Yongin-si (KR); Moo Hyun Kim, Yongin-si (KR); Do Woong Hong, Yongin-si (KR)

(73) Assignee: DOOSAN CORPORATION, Seoul (KR)

( * ) Notice: Subject to any disclaimer, the term of this patent is extended or adjusted under 35 U.S.C. 154(b) by 0 days. days.

(21) Appl. No.: 15/036,097

(22) PCT Filed: Nov. 25, 2014

(86) PCT No.: PCT/KR2014/011354
§ 371 (c)(1),
(2) Date: May 12, 2016

(87) PCT Pub. No.: WO2015/080445
PCT Pub. Date: Jun. 4, 2015

(65) Prior Publication Data
US 2016/0297967 A1    Oct. 13, 2016

(30) Foreign Application Priority Data

Nov. 26, 2013 (KR) ........................ 10-2013-0144872

(51) Int. Cl.
| | |
|---|---|
| *C08L 71/12* | (2006.01) |
| *H05K 1/02* | (2006.01) |
| *C08J 5/24* | (2006.01) |
| *C08L 63/00* | (2006.01) |
| *C08J 3/24* | (2006.01) |
| *H05K 1/03* | (2006.01) |

(52) U.S. Cl.
CPC ............... *C08L 71/12* (2013.01); *C08J 3/246* (2013.01); *C08J 5/24* (2013.01); *C08L 63/00* (2013.01); *H05K 1/0271* (2013.01); *H05K 1/0353* (2013.01); *C08J 2371/12* (2013.01); *C08J 2463/02* (2013.01); *C08J 2479/00* (2013.01); *H05K 2201/0129* (2013.01)

(58) Field of Classification Search
CPC ......... C08L 71/12; C08J 5/24; C08J 2371/12; C08J 2463/02; C08J 2479/00; H05K 1/0271
See application file for complete search history.

(56) References Cited

U.S. PATENT DOCUMENTS

2009/0247032 A1    10/2009  Mori et al.

FOREIGN PATENT DOCUMENTS

| JP | 2010-138366 | * | 6/2010 | ........... C08G 65/485 |
|---|---|---|---|---|
| JP | 2010-138366 A | | 6/2010 | |
| JP | 2012-169598 A | | 9/2012 | |
| KR | 10-2010-0090652 A | | 8/2010 | |
| KR | 10-2012-0079402 A | | 7/2012 | |
| KR | 2012-0079402 | * | 7/2012 | ............. C08G 59/40 |
| KR | 10-1236642 B1 | | 2/2013 | |

OTHER PUBLICATIONS

International Searching Authority International Search Report for PCT/KR2014/011354 filed Dec. 22, 2014.

* cited by examiner

*Primary Examiner* — Robert Harlan
(74) *Attorney, Agent, or Firm* — Sughrue Mion, PLLC

(57) ABSTRACT

The present disclosure provides: a thermosetting resin composition comprising: (a) bisphenol M-type epoxy resin; (b) bisphenol M-type cyanate ester resin; (c) polyphenylene ether having two or more vinyl groups at both ends of a branched chain, or oligomers thereof; and (d) a cross-linking curing agent, a prepreg comprising the composition, and a printed circuit board. The printed circuit board simultaneously has an excellent low dielectric loss characteristic, a great moisture-absorbing and heat-resistant characteristic, a low thermal expansion characteristic, thermal stability and the like.

16 Claims, No Drawings

THERMOSETTING RESIN COMPOSITION HAVING HEAT RESISTANCE AND LOW DIELECTRIC LOSS CHARACTERISTICS, PREPREG USING SAME, AND COPPER CLAD LAMINATE

CROSS REFERENCE TO RELATED APPLICATIONS

This application is a National Stage of International Application No. PCT/KR2014/011354 filed Nov. 25, 2014, claiming priority based on Korean Patent Application No. 10-2013-0144872 filed Nov. 26, 2013, the contents of all of which are incorporated herein by reference in their entirety.

TECHNICAL FIELD

The present disclosure relates to a novel thermosetting resin composition which may simultaneously exhibit an excellent low dielectric loss characteristic, a good moisture-absorbing and heat-resistant characteristic, a low thermal expansion characteristic, thermal stability and the like, a prepreg using the same, a functional laminate sheet, and a copper clad laminate.

BACKGROUND ART

Recently, the heat resistance of a material to be used has been required to increase in order to secure the processability and reliability of electronic parts such as a semiconductor substrate, a printed circuit board, and an epoxy molding compound (EMC). For example, by using a high melting point lead-free material which replaces lead-containing solder, a reflow temperature shows approximately 260° C. to 270° C. at the time of mounting a semiconductor and thus is increased by approximately several tens of temperature ° C. compared to the existing reflow temperatures.

Further, since the value of coefficient of thermal expansion (CTE) for a polymer material is larger by several to several ten times than the values of other materials (polymer material CTE: approximately 50 to 80 ppm/° C., silicon CTE: 3 to 5 ppm/° C., and copper CTE: 17 ppm/° C.), there occur product defects such as the generation of cracks on inorganic layers, the inner layer delamination, and the generation of warpage of a substrate due to the significant difference in coefficient of thermal expansion (CTE-mismatch) between these constituent components. Therefore, there is a need for developing a material having a high glass transition temperature (Tg) in order to have excellent refluidity and secure thermal expansion characteristics at high temperature compared to the existing materials.

Further, in order to increase the heat resistance of an FR-4 laminate in the related art, a method for increasing the glass transition temperature (Tg) by increasing the curing density through a method for increasing the number of epoxy functional groups was also used. However, as the number of epoxy functional groups is increased, the number of —OH (hydroxyl) groups is increased at the ends, and accordingly, the free volume is increased, so that the moisture absorption is facilitated, and as a result, the moisture resistance and dielectric characteristics are adversely affected.

Meanwhile, as the demand for high integration, high refinement, high performance, and the like in the semiconductor device and PCB fields is currently increased, the condition is gradually changed into a situation in which the integration of semiconductor devices, the high density of printed circuit boards, and the simplicity of the wiring interval are required. In order to satisfy these characteristics, it is preferred to use a low dielectric constant which facilitates the transmission rate and a low dielectric loss material for reducing the transmission loss. To exhibit these low dielectric characteristics, a poly(phenylene ether) (PPE) resin having excellent dielectric characteristics is also applied, but there occurs a problem with the handleability due to the crumbling of prepreg, and heat resistance has not yet been sufficient.

DISCLOSURE

Technical Problem

The present disclosure has been contrived to solve the aforementioned problems, and in consideration of the dielectric characteristics and heat resistance characteristics of various resins, a thermosetting resin composition having excellent overall physical properties including heat resistance and low dielectric constant characteristics has been prepared by using in combination poly(phenylene ether), a bisphenol M-type epoxy resin, a low dielectric cyanate ester, and a cross-linking curing agent, which are excellent in fracture toughness, dimensional stability, flame retardancy, and the like as well as excellent in dielectric characteristics, heat resistance, moisture resistance, and the like.

Thus, an object of the present disclosure is to provide a thermosetting resin composition which exhibits excellent heat resistance and low dielectric characteristics, a prepreg using the composition, and a copper clad laminate.

Technical Solution

The present disclosure provides a thermosetting resin composition including: (a) a bisphenol M-type epoxy resin; (b) a bisphenol M-type cyanate ester resin; (c) a polyphenylene ether having two or more vinyl groups at both ends of a molecular chain, or oligomers thereof; and (d) a cross-linking curing agent.

Here, the equivalent weight of the bisphenol M-type epoxy resin (a) is 200 to 2000 g/eq, and the weight average molecular weight (Mw) thereof is preferably in a range of 1,000 to 20,000.

According to a preferred embodiment of the present disclosure, it is preferred that the polyphenylene ether resin (c) is a polyphenylene ether resin in which a high molecular weight polyphenylene ether resin with a number average molecular weight in a range of 1,000 to 30,000 is subjected to redistribution reaction in the presence of a bisphenol-series compound (provided that bisphenol A is excluded) to modify the number average molecular weight into a low molecular weight in a range of 1,000 to 5,000.

Further, it is preferred that the cross-linking curing agent (d) is one or more selected from the group consisting of divinyl benzene, divinyl naphthalene, divinyl phenyl, triallyl isocyanurate (TAIL), triallyl cyanurate (TAC), 1,2,4-trivinyl cyclohexane, 1,7-octadiene, and 1,9-decadiene.

According to another preferred embodiment of the present disclosure, it is preferred that the thermosetting resin composition further includes one or more component selected from the group consisting of a flame retardant, an inorganic filler, a curing accelerator, and a radical initiator.

According to still another preferred embodiment of the present disclosure, it is preferred that the proportion of the bisphenol M-type epoxy resin and the bisphenol M-type cyanate ester resin used is in a weight ratio range of 1:1 to 1.6.

In addition, the present disclosure provides a prepreg including: a fibrous substrate; and the aforementioned thermosetting resin composition impregnated in the fibrous substrate.

Here, it is preferred that the fibrous substrate includes one or more selected from the group consisting of glass fiber, glass paper, glass fiber nonwoven fabric (glass web), glass cloth, aramid fiber, aramid paper, polyester fiber, carbon fiber, inorganic fiber, and organic fiber.

Furthermore, the present disclosure provides a printed circuit board which is laminated and molded by including one or more layers of the prepreg.

Advantageous Effects

Since the thermosetting resin composition according to the present disclosure improves the glass transition temperature (Tg) and simultaneously satisfies low coefficient of thermal expansion (CTE), low dielectric characteristics and heat resistance, a printed circuit board using the same may exhibit excellent high-frequency characteristics, good moisture absorbing heat resistance, and low thermal expansion characteristics.

Therefore, the thermosetting resin composition of the present disclosure may be useful for the use of parts of a printed circuit board used in various electric and electronic devices such as a mobile communication device which handles high-frequency signals of 1 GHz or more or a base station device thereof, a network-related electronic device such as a server and a router, and a large computer.

BEST MODE

Hereinafter, the present disclosure will be described in detail.

The present disclosure is intended to provide a thermosetting resin composition which may be useful for a printed circuit board, particularly, a multi-layer printed circuit board for high frequency applications.

Since the dielectric loss of an electric signal is proportional to the product of the square root of the relative permittivity of the insulating layer which forms a circuit, the dielectric tangent, and the square of the frequency of the electric signal, the higher the frequency of the electric signal is the greater the dielectric loss is. Therefore, in order to be used for an insulating layer of a high-frequency printed circuit board, it is required to use a material which is low in dielectric constant and dielectric loss factor (dielectric loss).

In order to satisfy the aforementioned low dielectric characteristics and dielectric loss characteristics, the present disclosure is intended to use poly(phenylene ether) (PPE) as a constituent component of the thermosetting resin composition, but in consideration of low heat resistance and an increase in viscosity of a PPE resin molten product incurred when PPE is used, a specific epoxy resin, cyanate ester, a curing agent, and the like which may compensate the physical properties of the PPE, are used in combination.

More specifically, the present disclosure may improve the glass transition temperature (Tg) and exhibit a low coefficient of thermal expansion (CTE) by modifying both ends of a poly(phenylene ether) molecular chain having excellent dielectric characteristics with an unsaturated double bond moiety, for example, a vinyl group (vinyl). Further, the moisture resistance and dielectric characteristics due to the reduction of —OH (hydroxy) group are satisfied to be enabled to be applied in the existing thermal curing systems.

Here, various physical properties and processability may be simultaneously secured through a study on the optimized content of the cross-linking agent triallyl isocyanurate (TAIC).

In addition, since a benzene structure and side chains are present on the main chain of the bisphenol M-type epoxy, heat resistance may be secured without adding functional groups, and excellent dielectric characteristics and heat resistance characteristics may be exhibited due to bonding to a bisphenol M-type (BPM) cyanate ester having excellent dielectric characteristics. In particular, by having a matrix form in the resin and having a simultaneous polymerization IPN (simultaneous interpenetrating polymer network (SIPN) structure with a radical bonding portion, a better thermal stability may be exhibited due to an improvement effect of physical properties using a resin mixed body, and low dielectric characteristics due to the minimization of polarization may be exhibited. Further, an improvement effect of thermal stability and low dielectric characteristics due to the physical cross-linking bond, which is caused by the structural similarity between epoxy and the main chain of cyanate ester, may be exhibited.

<Thermosetting Resin Composition>

The thermosetting resin composition according to the present disclosure may include: (a) a bisphenol M-type epoxy resin; (b) a bisphenol M-type cyanate ester resin; (c) a poly(phenylene ether) having two or more vinyl groups at both ends of a molecular chain, or oligomers thereof; and (d) a cross-linking curing agent. In this case, a flame retardant, an inorganic filler, a curing accelerator, a radical initiator, and the like and may be included, if necessary.

(a) Bisphenol M-Type Epoxy Resin

A first component constituting the thermosetting resin composition according to the present disclosure is an epoxy resin, and epoxy resin is not particularly limited in the structure as long as the epoxy resin is based on a ring structure and a symmetric structure in the main chain.

It is preferred that two or more epoxy groups are present in one molecule while the epoxy resin includes a benzene structure and hydrocarbon side chains, and for example, the epoxy resin may be an epoxy resin represented by the following Chemical Formula 1. This is because the melt viscosity is low and the reactivity is high while a ring structure and side chains in the epoxy main chain, so that the heat resistance may be secured even though other functional groups are not added. Further, the epoxy resin has a moiety having a symmetric structure and a ring structure in the main chain and thus has a structure of suppressing the orientation polarization of the polymer itself, which is advantageous in dielectric characteristics.

[Chemical Formula 1]

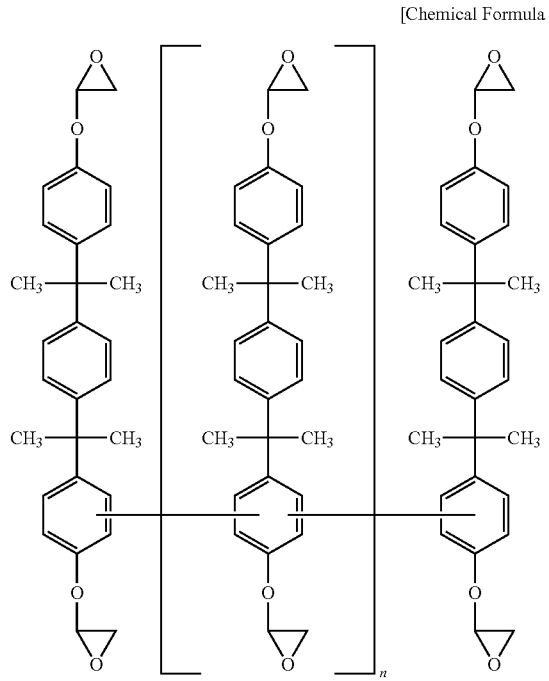

In the formula, n is a natural number of 2 to 30.

In the present disclosure, the equivalent weight of the bisphenol M-type epoxy resin may be in a range of 200 to 2,000 g/eq, preferably in a range of 200 to 1,000 g/eq. Further, the weight average molecular weight (Mw) of the epoxy resin may be in a range of 1,000 to 20,000, preferably in a range of 1,000 to 10,000, and more preferably in a range of 1,000 to 5,000.

In the thermosetting resin composition according to the present disclosure, the content of the bisphenol M-type epoxy resin may be in a range of 50 to 150 parts by weight, preferably in a range of 50 to 100 parts by weight, based on 100 parts by weight of the cyanate ester resin. When the content of the bisphenol M-type epoxy resin corresponds to the aforementioned range, the curability, molding processability, and adhesion of the resin composition are good.

In particular, when the content of the bisphenol M-type epoxy resin uses the range of 50 to 100 parts by weight with respect to the weight of the reactive site cyanate ester, dielectric characteristics may be improved by minimizing a functional group of the epoxy end to reduce the polar group.

In the present disclosure, a typical epoxy resin known in the art may be used in mixture with the aforementioned bisphenol M-type epoxy resin.

Non-limiting examples of an available epoxy resin include a bisphenol A-type/F-type/S-type resin, a novolac-type epoxy resin, an alkylphenol novolac-type epoxy resin, a biphenyl-type, an aralkyl-type, a dicyclopentadiene-type or mixed forms thereof, and the like. More specific examples thereof include a bisphenol A-type epoxy resin, a bisphenol F-type epoxy resin, a bisphenol S-type epoxy resin, a naphthalene-type epoxy resin, an anthracene epoxy resin, a biphenyl-type epoxy resin, a tetramethyl biphenyl-type epoxy resin, a phenol novolac-type epoxy resin, a cresol novolac-type epoxy resin, a bisphenol A novolac-type epoxy resin, a bisphenol S novolac-type epoxy resin, a biphenyl novolac-type epoxy resin, an aromatic hydrocarbon formaldehyde resin-modified phenol resin-type epoxy resin, a triphenylmethane-type epoxy resin, a tetraphenyl ethane-type epoxy resin, a dicyclopentadiene phenol addition reaction-type epoxy resin, a phenol aralkyl-type epoxy resin, a polyfunctional phenolic resin, a naphthol aralkyl-type epoxy resin, and the like. In this case, the aforementioned epoxy resin may be used either alone or in mixture of two or more thereof.

(b) Bisphenol M-Type Cyanate Ester Resin

A second component constituting the thermosetting resin composition according to the present disclosure is a cyanate ester (CE), and cyanate ester may be used without particular limitation on the structure as long as the cyanate ester includes two or more cyanate ester groups in the molecule.

Preferably, the second component is a bisphenol M-type cyanate ester [1,3-bis(4-cyanotophenyl-1-(1-methylethylidene))benzene] represented by the following Chemical Formula 2.

Since the physical interaction due to the similarity between the bisphenol M-type epoxy and the main chain is better than those of other cyanate esters, the following bisphenol M-type cyanate ester [1,3-bis(4-cyanotophenyl-1-(1-methylethylidene))benzene] exhibits excellent performance in heat resistance characteristics and dielectric characteristics.

[Chemical Formula 2]

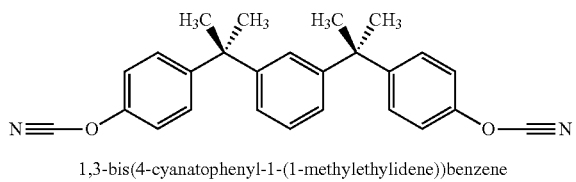

1,3-bis(4-cyanatophenyl-1-(1-methylethylidene))benzene

The cyanate ester (b) is a component which is reacted with the aforementioned epoxy resin to form a rigid skeletal structure, and thus imparts a high glass transition temperature (Tg). And due to a low viscosity, it is possible to maintain the high resin fluidity of the obtained resin composition.

Further, the cyanate ester (b) goes through a self-polymerization reaction among the cyanate ester compounds in the presence of a curing catalyst to form a triazine ring, thereby contributing to the improvement of heat resistance through the self-polymerization. In this case, as the used curing catalyst, it is possible to use a metal catalyst such as Zn, Cu, and Fe, 2-ethyl-4-iminidazole, 2-phenylimidazole, and the like.

In the thermosetting resin composition according to the present disclosure, the content of the bisphenol M-type cyanate ester (b) may be in a range of 50 to 200 parts by weight, preferably in a range of 100 to 150 parts by weight, based on 100 parts by weight of the epoxy resin. When the content of the cyanate ester corresponds to the aforementioned range, it is possible to obtain sufficient heat resistance of the resin composition, and it is possible to exhibit a high fluidity and excellent impregnation for a substrate.

In the present disclosure, when the content of the cyanate ester uses a range of 100 to 150 parts by weight with respect to the weight of the cyanate ester reaction site epoxy resin, there are an effect of reducing the polar groups by minimizing the functional group at the epoxy ends and a dielectric characteristic effect due to the formation of triazine caused by a self-reaction.

According to a preferred example of the present disclosure, it is appropriate for the content of the bisphenol M-type cyanate ester resin (BPM CE) to be higher than the content of the bisphenol M-type epoxy resin. For example, the ratio of the bisphenol M-type epoxy resin and the bisphenol M-type cyanate ester resin used is preferably in a weight ratio range of 1:1 to 1.6, more preferably in a weight ratio range of 1:1 to 1.5. In practice, in the present disclosure, when the content of the bisphenol M-type cyanate ester resin is higher than the content of the bisphenol M-type epoxy, it is possible to exhibit better low dielectric constant loss characteristics, low dielectric constant effects and high glass transition temperature effects.

(c) Poly(phenylene ether)

A third component constituting the thermosetting resin composition according to the present disclosure is a polyphenylene ether (PPE) or oligomers thereof, and polyphenylene ether or oligomers thereof may be used without particular limitation on the structure as long as the polyphenylene ether or oligomers thereof has two or more vinyl groups at both ends of a molecular chain.

In the present disclosure, an allylated poly(phenylene ether) represented by the following Chemical Formula 3 is preferred. This is because the side is modified with two or more vinyl groups or allyl groups, thereby satisfying moisture resistance characteristics and dielectric characteristics due to the improvement of the glass transition temperature, a low coefficient of thermal expansion, and reduction of —OH groups.

a form modified into a lower molecular weight than the high molecular weight polyphenylene ether through a redistribution reaction.

In particular, when a high molecular weight polyphenylene ether in the related art is modified into a low molecular weight polyphenylene ether resin, a compound such a phenol derivative or bisphenol A is generally used, and in this case, the molecular structure may be rotated, and thus a reduction in the dielectric constant is generated.

Meanwhile, in the present disclosure, instead of using the high molecular weight polyphenylene ether (PPE) resin in the related art as it is, a form in which a vinyl group is introduced into both ends of the resin through the redistribution is used as a form modified into a low molecular weight through a redistribution reaction using specific bisphenol derivatives in which the content of an alkyl group and the content of an aromatic ring group are increased.

That is, a polyphenylene ether for a copper clad laminate in the related art is used by modifying a high molecular weight polymer polyphenylene ether into a low molecular weight polymer polyphenylene ether having an alcohol group at both ends through a redistribution reaction in which polyphenol and a radical initiator are used as a catalyst, but due to the structural characteristics of bisphenol A, which is a polyphenol used in the redistribution in the related art, and the high polarity of an alcohol group at both ends, which is produced after the redistribution, there is a limitation on implementing low dielectric loss characteristics.

In contrast, in the present disclosure, it is possible to obtain a polyphenylene ether with low dielectric loss after the cross-linkage by redistributing a polyphenylene by using specific bisphenol derivatives in which the content of an alkyl group and the content of an aromatic ring group are

[Chemical Formula 3]

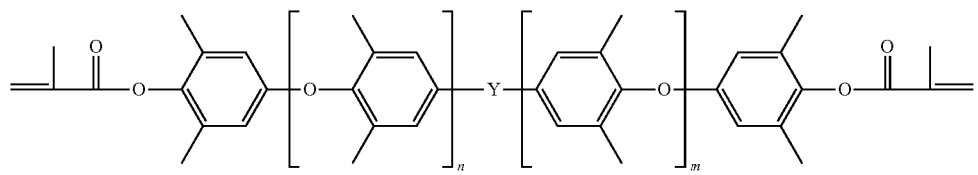

In Chemical Formula 3,

Y is selected from the group consisting of a bisphenol A-type epoxy resin, a bisphenol F-type epoxy resin, a bisphenol S-type epoxy resin, a naphthalene-type epoxy resin, an anthracene epoxy resin, a biphenyl-type epoxy resin, a tetramethyl biphenyl-type epoxy resin, a phenol novolac-type epoxy resin, a cresol novolac-type epoxy resin, a bisphenol A novolac-type epoxy resin, and a bisphenol S novolac-type epoxy resin, and m and n are each independently a natural number of 3 to 20.

In the present disclosure, a poly(phenylene ether) having two or more vinyl groups at both ends of a molecular chain is mainly used, but the use of a typical unsaturated double known in the art in addition to the vinyl group belongs to the category of the present disclosure.

Meanwhile, the poly(phenylene ether) essentially has a high melting point, and accordingly, the molten product of the resin composition has high viscosity, so that it is difficult to produce a multi-layer sheet. Thus, in the present disclosure, instead of using a high molecular weight polyphenylene ether in the related art as it is, it is preferred to use increased to, and then modifying an alcohol group disposed at both ends with a vinyl group having low polarity. Since the modified polyphenylene ether has a lower molecular weight than conventional polyphenylene derivatives and has a high content of an alkyl group, the compatibility with the existing epoxy resin and the like is excellent, and the fluidity is increased when a laminate is prepared, so that the processability is improved, and dielectric characteristics are additionally improved. Therefore, a printed circuit board prepared using the resin composition of the present disclosure has an advantage in that physical properties such as moldability, processability, dielectric characteristics, heat resistance, and adhesion strength are enhanced.

In this case, in the specific bisphenol derivative compound in which the content of an alkyl group and the content of an aromatic ring group are increased, a bisphenol-series compound except for bisphenol A [BPA, 2,2-bis(4-hydroxyphenyl)propane] may be used without limitation. Non-limiting examples of an available bisphenol derivative include bisphenol AP (1,1-bis(4-hydroxyphenyl)-1-phenyl-ethane), bisphenol AF (2,2-bis(4-hydroxyphenyl)hexafluoropropane), bisphenol B (2,2-bis(4-hydroxyphenyl)butane), bisphenol BP (bis-(4-hydroxyphenyl)diphenylmethane), bisphenol C (2,2-bis(3-methyl-4-hydroxyphenyl)propane), bisphenol C (bis(4-hydroxyphenyl)-2,2-dichlorethylene), bisphenol G (2,2-bis(4-hydroxy-3-isopropyl-phenyl)propane), bisphenol M (1,3-bis(2-(4-hydroxyphenyl)-2-propyl) benzene), bisphenol P (bis(4-hydroxyphenyl)sulfone), bisphenol PH (5,5'-(1-Methylethyliden)-bis[1,1'-(bisphenyl)-2-ol]propane), bisphenol TMC (1,1-bis(4-hydroyphenyl)-3,3, 5-trimethyl-cyclohexane), bisphenol Z (1,1-bis(4-hydroxyphenyl)-cyclohexane) or a mixture of one or more thereof, and the like.

The polyphenylene ether resin may be modified with a low molecular weight polyphenylene ether resin having a lower number average molecular weight (Mn) in a range of 1,000 to 5,000 than a high molecular weight polyphenylene ether resin by subjecting the high molecular weight polyphenylene ether resin having a number average molecular weight in a range of 10,000 to 30,000 to redistribution reaction in the presence of a bisphenol-series compound (provided that bisphenol A is excluded), and preferably, the number average molecular weight thereof may be in a range of 2,000 to 3,000.

(d) Cross-Linking Curing Agent

A fourth component constituting the thermosetting resin composition according to the present disclosure is a cross-linking curing agent.

The cross-linking curing agent is used to form a network structure by 3-dimensionally cross-linking the poly(phenylene ether). Even though a poly(phenylene ether) modified with a low molecular weight is used in order to increase the fluidity of the resin composition, the use of the cross-linking curing agent contributes to the improvement of heat resistance of the poly(phenylene ether). Further, the cross-linking curing agent has an effect of increasing the fluidity of the resin composition and enhancing the peel strength with another substrate (for example, copper foil).

It is preferred that the side in the cross-linking curing agent according to the present disclosure has excellent miscibility with a polyphenylene ether modified with a vinyl group. Non-limiting examples of an available cross-linking curing agent include: a vinylbenzyl ether compound-series divinylbenzene, divinylnaphthalene, divinyldiphenyl, a styrene monomer, an allylether compound prepared by reaction of phenol and allylchloride; triallyl isocyanurate (TAIC), triallyl cyanurate (TAC), 1,2,4-trivinyl cyclohexane, diene series such as 1,7-octadiene and 1,9-decadiene, and the like. In this case, the aforementioned curing agent may be used either alone or in mixture of two or more thereof.

Specific examples of a preferred cross-linking curing agent may be any one of compounds represented by the following Chemical Formulae 4 to 7. This is because these compounds have excellent compatibility and allow the thermosetting curing composition to have excellent moldability, a small dielectric constant value, excellent heat resistance, and reliability.

[Chemical Formula 4]

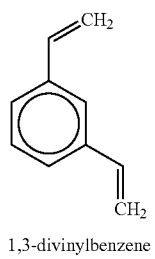

1,3-divinylbenzene

[Chemical Formula 5]

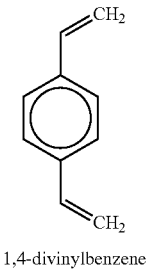

1,4-divinylbenzene

[Chemical Formula 6]

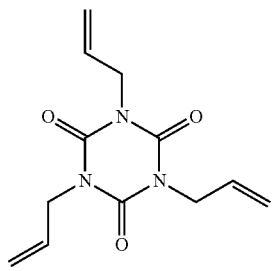

[Chemical Formula 7]

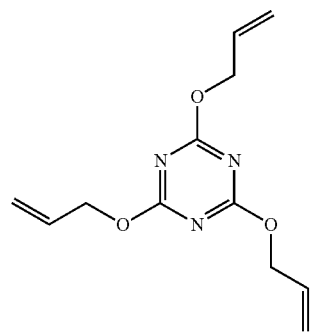

In the thermosetting resin composition according to the present disclosure, the content of the cross-linking curing agent may be in a range of 5 to 30 parts by weight, preferably in a range of 5 to 20 parts by weight, based on the total weight of the poly(phenylether) resin mixture. When the content of the cross-linking curing agent corresponds to the aforementioned range, the curability, molding processability, and adhesion of the resin composition are good.

According to a preferred embodiment of the present disclosure, the thermosetting resin composition may include: (a) 5 to 25 parts by weight of a bisphenol M-based epoxy resin; (b) 5 to 35 parts by weight of a bisphenol M-type cyanate ester resin; (c) 35 to 70 parts by weight of a polyphenylene ether resin having two or more vinyl groups on the side chain in the molecule; and (d) 5 to 30 parts by weight of a cross-linking curing agent.

(e) Flame Retardant

The thermosetting resin composition according to the present disclosure may further include (e) a flame retardant, if necessary.

As the flame retardant, a typical flame retardant known in the art may be used without limitation, and as an example, it is possible to exemplify a halogen flame retardant containing bromine or chlorine, a phosphorus-based flame retardant such as triphenyl phosphate, tricresyl phosphate, trisdichloropropylosphate, and phosphagen, an antimony-based flame retardant such as antimony trioxide, a flame retardant of an inorganic material such as aluminum hydroxide and magnesium hydroxide, and the like. In the present disclosure, an addition-type bromine flame retardant, which has no reactivity with poly(phenylene ether) and does not cause a deterioration in heat resistance characteristics and dielectric characteristics, is suitable.

As a brominated flame retardants in the present disclosure, a reactive bromine flame retardant having at least two epoxies or polycarbonates in the molecule, and an addition-type bromine flame retardant such as bromophthalimide and bromophenyl may be used without limitation. Further, when tetrabromo bisphenol A allyl ether in the allyl terminated form or divinylphenol is used as a flame retardant, characteristics of a curing agent and flame retardant characteristics may be simultaneously obtained. In addition, a brominated organic compound may also be used, and specific examples thereof include decabromodiphenyl ethane, 4,4-dibromobiphenyl, ethylene bistetrabromo phthalimide, and the like.

In the thermosetting resin composition according to the present disclosure, the content of the flame retardant may be a ratio of 10 to 30 parts by weight with respect to 100 parts by weight of the entire thermosetting resin composition, and preferably in a range of 10 to 20 parts by weight. When the flame retardant is included in the range, sufficient flame resistance at the flame retardancy 94V-0 level may be obtained, and excellent heat resistance and electrical characteristics may be exhibited.

(f) Inorganic Filler

The thermosetting resin composition according to the present disclosure may further include a typical inorganic filler (f) known in the art and used in the laminate, if necessary.

The inorganic filler reduces the difference in the coefficient of thermal expansion (CTE) between the resin layer and another layer and thus may effectively enhance warpage characteristics, low expansion, mechanical strength (toughness), and low stress.

Non-limiting examples of an inorganic filler which may be used in the present disclosure include: silicas such as natural silica, fused silica, amorphous silica, and crystalline silica; boehmite, alumina, talc, spherical glass, calcium carbonate, magnesium carbonate, magnesia, clay, calcium silicate, titanium oxide, antimony oxide, glass fiber, aluminum borate, barium titanate, strontium titanate, calcium titanate, magnesium titanate, bismuth titanate, titanium oxide, barium zirconate, calcium zirconate, boron nitride, silicon nitride, talc, mica, and the like. These inorganic fillers may be used either alone or in mixture of two or more thereof.

Among the inorganic fillers, fused silica showing a low coefficient of thermal expansion is most preferred.

The size of the inorganic filler in the present disclosure is not particularly limited, but a range of 0.5 to 5 µm in the average particle diameter is advantageous in terms of dispersion. In addition, the content of the inorganic filler is not particularly limited, and may be appropriately adjusted in consideration of the aforementioned warpage characteristics, mechanical properties, and the like. As an example, a range of 10 to 50 parts by weight with respect to 100 parts by weight of the entire thermosetting resin composition varnish is preferred. An excessive content of the inorganic filler may be disadvantageous for moldability.

The thermosetting resin composition according to the present disclosure may further include a reaction initiator in order to enhance an advantageous effect of a cross-linking curing agent.

The reaction initiator may further accelerate the curing of the polyphenylene ether and the cross-linking curing agent, and may enhance characteristics such as heat resistance of the resin.

Non-limiting examples of an available reaction initiator include α,α'-bis(t-butylperoxy-m-isopropyl)benzene, 2,5-dimethyl-2,5-di(t-butylperoxy)-3-hexyne, benzoyl peroxide, 3,3',5,5'-tetramethyl-1,4-diphenoxyquinone, chloranil, 2,4,6-tri-t-butylphenoxyl, t-butylperoxyisopropyl monocarbonate, azobisisobutylonitrile, and the like. Additionally, a metal carboxylate salt may be further used. The reaction initiator may be included in an amount of 2 to 5 parts by weight with respect to 100 parts by weight of a polyphenylene ether, but the content is not limited thereto.

Furthermore, the thermosetting resin composition of the present disclosure may additionally include a curing accelerator. As the curing accelerator, it is possible to use an organic metal salt or an organic metal complex including one or more metals selected from the group consisting of iron, copper, zinc, cobalt, lead, nickel, manganese, and tin.

Examples of the organic metal salt or the organic metal complex include iron naphthenates, copper naphthenates, zinc naphthenates, cobalt naphthenates, nickel naphthenates, manganese naphthenates, tin naphthenates, zinc octanoate, tin octanoate, iron octanoate, copper octanoate, zinc 2-ethylhexanate, lead acetylacetonate, cobalt acetylacetonate, or dibutyl tin maleate and the like, but the examples are not limited thereto. Further, these organic metal salts or organic metal complexes may be used alone or in mixture of two or more thereof. The curing accelerator may be included in an amount of 0.1 to 1 part by weight with respect to 10 to 60 parts by weight of the polyphenylene ether, but the content is not limited thereto.

In addition to the aforementioned components, the thermosetting resin composition of the present disclosure may additionally include a flame retardant generally known in the art, or various polymers such as other thermosetting resins or thermoplastic resins, which are not described above, and oligomers thereof, other additives such as solid rubber particles or an ultraviolet absorber, an antioxidant, a polymerization initiator, a dye, a pigment, a dispersing agent, a thickener, and a leveling agent, and the like, if necessary, as long as the additives do not impair inherent characteristics of the resin composition. An example thereof includes: an organic filler such as a silicone-based powder, a nylon powder, and a fluorine resin powder, and a thickener such as orbene and bentone; a polymer-based antifoaming agent such as silicone-based and fluorine resin-based antifoaming agents or a leveling agent; an adhesion imparting agent such as imidazole-based, thiazole-based, triazole-based, and silane-based coupling agents; a coloring agent such as phthalocyanine and carbon black, and the like.

For the purpose of imparting appropriate flexibility to the resin composition after curing, a thermoplastic resin may be blended with the thermosetting resin composition. Examples of the thermoplastic resin include a phenoxy resin, a polyvinylacetal resin, polyimide, polyamideimide, polyethersulfone, polysulfone, and the like. These thermoplastic resins may be used either alone or in combination of two or more thereof.

Examples of the resin additive include: an organic filler such as a silicone powder, a nylon powder, and a fluorine powder; a thickener such as orbene and bentone; a polymer-based antifoaming agent such as silicone-based and fluorine-based antifoaming agents or a leveling agent; an adhesion imparting agent such as imidazole-based, thiazole-based, triazole-based, and silane-based coupling agents, epoxysilane, aminosilane, alkylsilane, and mercaptosilane; a coloring agent such as phthalocyanine•blue, phthalocyanine•green, iodine•green, Disazo yellow, and carbon black; a release agent such as higher fatty acids, higher fatty acid metal salts, and ester-based wax; a stress reliever such as modified silicone oil, silicone powder, and silicone resin, and the like. Further, the examples may include additives typically used in a thermosetting resin composition used for the production of electronic devices (particularly, printed wiring boards).

By the subsequent curing, the aforementioned thermosetting resin composition of the present disclosure will have a simultaneous interpenetrating polymer network (SIPN) structure including a specific repeating unit derived from (a) a bisphenol M-type epoxy resin; (b) a bisphenol M-type cyanate ester resin; (c) a polyphenylene ether having two or more vinyl groups at both ends of a molecular chain, or oligomers thereof; and (d) a cross-linking curing agent.

Here, in the simultaneous interpenetrating polymer network (SIPN) structure, an IPN is formed by mixing polymeric monomers of two components, and then simultaneously performing a polymerization and a cross-linking reaction by different polymerization mechanisms, and generally, and there is an advantage in that low molecular weight monomers have good compatibility with each other and a design degree of freedom for the composition. Furthermore, opposing monomers are mixed with each other to form a homogeneous phase and initiate the reaction and thus have an advantage in terms of physical properties, thereby further enhancing the thermal stability of a final cured product.

<Prepreg>

The prepreg of the present disclosure includes a fibrous substrate, and the aforementioned thermosetting resin composition impregnated in the fibrous substrate. Here, the thermosetting resin composition may also be a resin varnish in the form of being dissolved or dispersed in a solvent.

As the fibrous substrate, it is possible to use an inorganic material fibrous substrate, an organic material fibrous substrate, or a mixed form thereof, which is arbitrarily bendable, has flexibility, and is typical in the art. Based on the use or performance to be used, the aforementioned fibrous substrate may be selected.

Non-limiting examples of an available fibrous substrate include: glass fiber (inorganic fiber) such as E-glass, D-glass, S-glass, NE-glass, T-glass, and Q-glass; an organic fiber such as glass paper, glass fiber nonwoven fabric (glass web), glass cloth, aramid fiber, aramid paper, polyimide, polyamide, polyester, an aromatic polyester, and a fluorine resin; carbon fiber, paper, inorganic fiber, or a mixed form of one or more thereof, and the like. Examples of a form of the fibrous substrate include: woven fabric or nonwoven fabric composed of the aforementioned fiber, and the like; and woven fabric, nonwoven fabric, and mats composed of roving, chopped strand mat, surfacing mat, metal fiber, carbon fiber, mineral fiber, and the like. These substrates may be used either alone or in mixture of two or more thereof. When a reinforced fibrous substrate is used in mixture, the rigidity and dimensional stability of the prepreg may be enhanced. The thickness of the fibrous substrate is not particularly limited, and may be, for example, in a range of about 0.01 mm to 0.3 mm.

The resin composition is used for forming the prepreg, and the aforementioned thermosetting resin composition of the present disclosure may be used.

In general, the prepreg refers to a sheet-like material obtained by coating or impregnating a fibrous substrate with a thermosetting resin composition, and then curing the fibrous substrate to the B-stage (half-curing state) by means of heating. In addition to the aforementioned method, the prepreg of the present disclosure may be prepared by a hot-melt method, a solvent method, and the like publicly known in the art. The solvent method is a method in which a fibrous substrate is impregnated with a resin composition varnish formed by dissolving a thermosetting resin composition for forming a prepreg in an organic solvent, and then dried. When the solvent method is adopted, a resin varnish is generally used. An example of the method for impregnating the resin composition in a fibrous substrate include a method for immersing a substrate in a resin varnish, a method for applying a resin varnish onto a substrate by various coaters, a method for spraying a resin varnish onto a substrate by spray, and the like. In this case, when the fibrous substrate is immersed in the resin varnish, the impregnating property of the resin composition for the fibrous substrate may be improved, which is preferred.

When the resin composition varnish is prepared, examples of the organic solvent include ketones such as acetone, methyl ethyl ketone and cyclohexanone, acetic acid esters such as ethyl acetate, butyl acetate, cellosolve acetate, propylene glycol monomethyl ether acetate, and carbitol acetate, carbitols such as cellosolve and butyl carbitol, aromatic hydrocarbons such as toluene and xylene, dimethylformamide, dimethylacetamide, N-methylpyrrolidone, tetrahydrofuran, and the like. The organic solvents may be used either alone or in combination of two or more thereof.

Further, the hot-melt method may be a method in which a resin composition is not dissolved in an organic solvent, but is coated onto a release paper having excellent peeling property with the resin composition, and then the resulting release paper is laminated on a sheet-like fibrous substrate, or the resin composition is directly coated onto the sheet-like fibrous substrate by a die coater. In addition, the prepreg may also be prepared by continuously thermally laminating an adhesion film, which is composed of a thermosetting resin composition laminated on a support, under heated and pressurized conditions from both surfaces of a sheet-like reinforced substrate.

The resin composition of the present disclosure may be prepared as a prepreg by coating or impregnating a sheet-like fibrous substrate composed of fiber or a glass substrate with the resin composition, and half-curing the substrate by heating. The prepreg is preferably a prepreg for a printed circuit board. In this case, the resin composition may be prepared using a resin varnish.

The prepreg of the present disclosure may be formed by coating or impregnating the substrate with the resin composition, and additionally performing a drying process, and in this case, the drying may be performed at 20 to 200° C. As an example, the prepreg of the present disclosure may be prepared as a prepreg in a half-curing (B-Stage) state by impregnating a substrate with the thermosetting resin composition varnish, and heating and drying the substrate at 70 to 170° C. for 1 to 10 minutes.

<Resin Coated Copper Foil>

The present disclosure provides a resin coated metal foil including: a metal foil; and a resin layer formed on one surface or both surfaces of the metal foil, in which the thermosetting resin composition is cured.

In the resin coated metal foil of the present disclosure, as the metal foil, a metal foil composed of a typical metal or an alloy known in the art may be used without limitation. In this case, when the metal foil is a copper foil, it is possible to use a laminate, which is formed by coating the copper foil with the thermosetting resin composition according to the present disclosure and drying the copper foil, as a copper clad laminate. The metal foil is preferably a copper foil.

The copper foil includes all the copper foils prepared by a rolling method and an electrolytic method. Here, the copper foil may be subjected to rust-prevention treatment in order to prevent the surface thereof from being oxidized and corroded.

In the metal foil, a predetermined surface roughness (Rz) may also be formed on one surface where the thermosetting resin composition is brought into contact with a cured resin layer. In this case, the surface roughness (Rz) is not particularly limited, but may be, for example, in a range of 0.6 µm to 3.0 µm.

Furthermore, the thickness of the metal foil is not particularly limited, but may be less than 5 µm in consideration of the thickness and mechanical properties of a final product, and may be preferably in a range of 1 to 3 µm.

<Laminate and Printed Circuit Board>

The present disclosure includes a laminate formed by overlapping two or more of the aforementioned prepreg, and then heating and pressurizing the overlapped prepregs under a typical condition.

Further, the present disclosure includes a copper clad laminate formed by laminating the prepreg and the copper foil, and subjecting the resulting product to heat and pressure molding under a typical condition. In this case, during the molding of the laminate, the heated and pressurized condition may be appropriately adjusted according to the thickness of a laminate to be prepared, or the type of thermosetting resin composition according to the present disclosure, and the like.

Furthermore, the present disclosure includes a printed circuit board laminated and molded by including one or more selected from the group consisting of the prepreg, an insulating resin sheet, and a resin coated copper foil, preferably a multi-layer printed circuit board.

The printed circuit board in the present disclosure refers to a printed circuit board in which one or more layers are laminated by a plated through-hole method or a build-up method, and the like, and the printed circuit board may be obtained by superimposing and aligning the aforementioned prepreg or an insulating resin sheet with an inner layer wiring board, and subjecting the resulting product to heat and pressure molding.

The printed circuit board may be prepared by a typical method known in the art. As a preferred example thereof, the printed circuit board may be prepared by laminating a copper foil on one surface or both surfaces of the prepreg according to the present disclosure and heating and pressurizing the resulting product to prepare a copper clad laminate, perforating holes on the copper clad laminate to perform a through hole plating, and then subjecting a copper foil including a plated film to etching treatment to form a circuit.

As explained above, the prepreg and the printed circuit board may be prepared from the thermosetting resin composition according to the present disclosure. It could be seen that the prepreg and the printed circuit board had a low dielectric constant and a dielectric loss as well as low coefficient of thermal expansion (CTE), a high glass transition temperature (Tg), and excellent heat resistance (see the following Table 1). Therefore, the prepreg and printed circuit board of the present disclosure may be useful for the use of parts of a printed circuit board for a network used in various electric and electronic devices such as a mobile communication device which handles high-frequency signals of 1 GHz or more or a base station device thereof, a network-related electronic device such as a server and a router, and a large computer.

Hereinafter, the present disclosure will be specifically described through the Examples, but the following Examples and Experimental Examples only exemplify an embodiment of the present disclosure, and the scope of the present disclosure is not limited by the following Examples and Experimental Examples. Further, in the following description, "parts" mean "parts by mass".

EXAMPLES 1 TO 6

1. Preparation of Resin Composition

A resin composition was prepared by mixing the bisphenol M-type epoxy resin, the bisphenol M-type cyanate ester-based resin, the polyphenylene ether, the cross-linking curing agent, the curing accelerator, and the inorganic filler according to the composition described in the following Table 1. In the following Table 1, the unit for the amount of each composition used is a part by weight.

2. Preparation of Prepreg and Printed Circuit Board

A prepreg was prepared by impregnating the prepared resin composition in glass fiber, and then drying the impregnated glass fiber at 165° C. for 3 to 10 minutes. A laminated thin plate having a thickness of 0.1 mm was obtained by laminating the prepreg as 1 ply, and then pressing the resulting product.

COMPARATIVE EXAMPLES 1 AND 2

A resin composition, a prepreg, and a printed circuit board were prepared in the same manner as in the Examples, except for the composition described in the following Table 1. In the following Table 1, the unit for the amount of each composition used is a part by weight.

TABLE 1

|  | Example 1 | Example 2 | Example 3 | Example 4 | Comparative Example 1 | Comparative Example 2 | Comparative Example 3 |
|---|---|---|---|---|---|---|---|
| BPM-Based Epoxy | 6 | 6 | 6 | 8 |  | 6 | 6 |
| Phenol novolac epoxy |  |  |  |  | 6 |  |  |
| BPM CE | 6 | 8 | 10 | 6 | 8 |  |  |
| BPA CE |  |  |  |  |  | 8 |  |
| DCPD-based CE |  |  |  |  |  |  | 8 |

TABLE 1-continued

| | Example 1 | Example 2 | Example 3 | Example 4 | Comparative Example 1 | Comparative Example 2 | Comparative Example 3 |
|---|---|---|---|---|---|---|---|
| Allylate PPE | 40 | 40 | 40 | 40 | 40 | 40 | 40 |
| Curing accelerator (TAIC) | 5 | 5 | 5 | 5 | 5 | 5 | 5 |
| Curing accelerator (DVB) | 5 | 5 | 5 | 5 | 5 | 5 | 5 |
| Flame retardant | 10 | 10 | 10 | 10 | 10 | 10 | 10 |
| Initiator | 2 | 2 | 2 | 2 | 2 | 2 | 2 |
| Inorganic filler | 30 | 30 | 30 | 30 | 30 | 30 | 30 |
| DSC Tg (° C.) | 182 | 185 | 184 | 173 | 172 | 169 | 174 |
| CTE (%) | 2.7 | 2.5 | 2.7 | 3.1 | 3.4 | 3.6 | 3.5 |
| W/A | 0.19 | 0.16 | 0.18 | 0.22 | 0.18 | 0.22 | 0.23 |
| Solder Folting (@288° C.) | >60 | >60 | >60 | >60 | >60 | >60 | >60 |
| PCT (4 hr) | OK | OK | NG | OK | NG | NG | NG |
| Dielectric constant (Dk @1 GHz) | 3.80 | 3.65 | 3.83 | 3.95 | 3.86 | 3.90 | 3.96 |
| Dielectric loss (Df @1 GHz) | 0.0027 | 0.0023 | 0.0030 | 0.0030 | 0.0033 | 0.0033 | 0.0035 |
| Flame retardancy | V-0 | V-0 | V-0 | V-0 | V-0 | V-0 | V-0 |
| P/S (kgf/cm) | 0.8 | 0.8 | 0.6 | 0.9 | 0.8 | 0.7 | 0.7 |

(Note) 1) BPM-based epoxy resin: SD-681A (230 g/eq)
2) Biphenyl-based epoxy resin: NC-3000H (290 g/eq)
3) DCPD-based epoxy resin: XD-1000 (253 g/eq)
4) Phenol novolac-type epoxy resin: YDPC-638 (170 to 190 g/eq)
5) BPM cyanate ester: XU-366
6) BPA cyanate ester: BA-3000S
7) DCPD-based cyanate ester: Nanozine 375
9) Allylated PPE: MX-9000 (Number average molecular weight: 2,000 to 3,000)
10) Flame retardant: Saytex 8010 (Albemarle Asano Corporation)
11) Initiator: Perbutyl P (Manufacturer NOF Corporation)
12) Inorganic filler: SC-5200SQ (Manufacturer Admatechs)

EXPERIMENTAL EXAMPLE 1. PHYSICAL PROPERTIES OF PRINTED CIRCUIT BOARD

On the printed circuit boards prepared in Examples 1 to 6 and Comparative Examples 1 and 2, the following experiments were performed, and the results are shown in Table 1.

1) Heat resistance: The heat resistance was evaluated by floating the printed circuit board at solder 288° C. in accordance with the IPC-TM-650 2.4.13 evaluation standard to measure the time point when a separation phenomenon occurred between the insulating layer and the copper foil and between the insulating layer and the metal core or the insulating layer.

2) Copper foil adhesion (Peel Strength, P/S): The copper foil adhesion was evaluated by lifting a circuit pattern formed on the printed circuit board in the 90° direction in accordance with the IPC-TM-650 2.4.8 evaluation standard to measure the time point when the circuit pattern (copper foil) was peeled off.

3) Evaluation of flame retardancy: The flame retardancy was performed in accordance with the test method of UL94 (V method) by preparing an evaluation substrate with a length of 127 mm and a width of 12.7 mm from an evaluation substrate from which a copper foil was removed by impregnating the copper clad laminate with a copper etching liquid.

4) Measurement of TMA glass transition temperature: The TMA glass transition temperature was evaluated by preparing an evaluation substrate at each side by 5 mm from an evaluation substrate from which a copper foil was removed by impregnating the copper clad laminate with a copper etching liquid, and using a TMA test device (TA Instrument, Q400) to observe thermal expansion characteristics of the evaluation substrate.

5) Evaluation of moisture-absorbing heat resistance (PCT): The moisture-absorbing heat resistance was evaluated by preparing an evaluation substrate from which a copper foil was removed by impregnating the copper clad laminate with a copper etching liquid, using an autoclave test device (ESPEC, EHS-411MD) to leave the evaluation substrate to stand under the conditions of 121° C. and 0.2 MPa for 4 hours, and then dipping the printed circuit board at solder 288° C. at an interval of 10 seconds to measure the time point when a separation phenomenon occurred between the insulating layer and the copper foil and between the insulating layer and the metal core or the insulating layer.

6) Measurement of relative permittivity and dielectric tangent: The relative permittivity and the dielectric tangent were measured at a frequency of 1 GHz by a relative permittivity measuring device (RF Impedance/Material Analyzer; Agilent) using a substrate from which a copper foil was removed by impregnating the copper laminate with a copper etching liquid.

7) Measurement of glass transition temperature (Tg): About 5 mg of a sample was heated to 300° C. at a rate of 10° C./min by DSC2010 and DSC2910 from TA Instruments Co., Ltd. as a DSC measuring device, and then cooled to 30° C. at a rate of 10° C./min. The first heating/cooling process was performed two times as the same process.

As a result of the experiments, it could be seen that the thermosetting resin composition of the present disclosure had excellent low dielectric loss characteristics and a low dielectric constant, and simultaneously, exhibited a high glass transition temperature (Tg), excellent heat resistance, low thermal expansion characteristics, thermal stability, and the like (see Table 1).

The invention claimed is:

1. A thermosetting resin composition comprising:
   (a) a bisphenol M-type epoxy resin;
   (b) a bisphenol M-type cyanate ester resin;
   (c) a polyphenylene ether having two or more vinyl groups at both ends of a molecular chain, or oligomers thereof; and
   (d) a cross-linking curing agent,
   wherein an equivalent weight of the bisphenol M-type epoxy resin (a) is 200 to 2,000 g/eq, and a weight average molecular weight (Mw) of the bisphenol M-type epoxy resin (a) is in a range of 1,000 to 20,000.

2. The thermosetting resin composition of claim 1, wherein the bisphenol M-type epoxy resin (a) is represented by the following Chemical Formula 1:

Chemical Formula 1

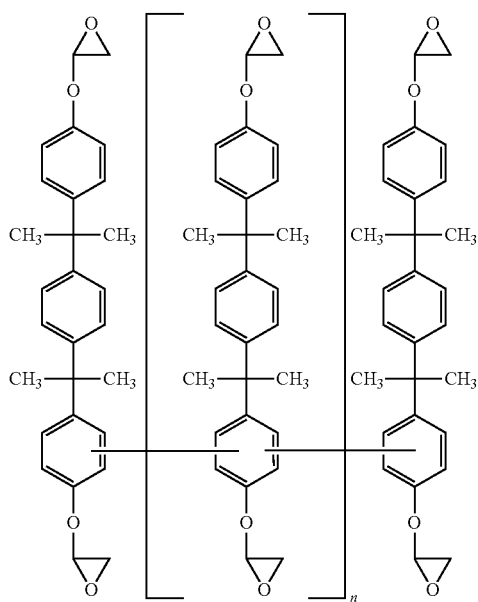

wherein n is a natural number of 2 to 30.

3. The thermosetting resin composition of claim 1, wherein the bisphenol M-type cyanate ester resin (b) is represented by the following Chemical Formula 2:

Chemical Formula 2

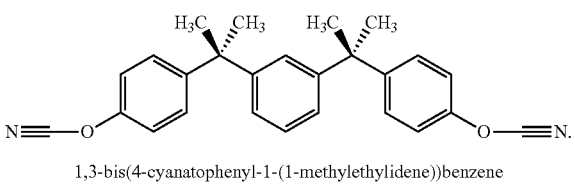

1,3-bis(4-cyanatophenyl-1-(1-methylethylidene))benzene

4. The thermosetting resin composition of claim 1, wherein the polyphenylene ether resin (c) is represented by the following Chemical Formula 3:

Chemical Formula 3

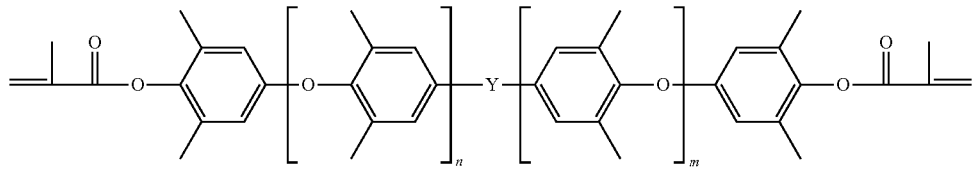

wherein
Y is selected from the group consisting of a bisphenol A-type epoxy resin, a bisphenol F-type epoxy resin, a bisphenol S-type epoxy resin, a naphthalene-type epoxy resin, an anthracene epoxy resin, a biphenyl-type epoxy resin, a tetramethyl biphenyl-type epoxy resin, a phenol novolac-type epoxy resin, a cresol novolac-type epoxy resin, a bisphenol A novolac-type epoxy resin, and a bisphenol S novolac-type epoxy resin, and
m and n are each independently a natural number of 3 to 20.

5. The thermosetting resin composition of claim 1, wherein the polyphenylene ether resin (c) is a polyphenylene ether resin in which a high molecular weight polyphenylene ether resin with a number average molecular weight in a range of 10,000 to 30,000 is subjected to redistribution reaction in the presence of a bisphenol-series compound, provided that bisphenol A is excluded, to modify the number average molecular weight with a low molecular weight in a range of 1,000 to 5,000.

6. The thermosetting resin composition of claim 5, wherein the redistribution reaction of the polyphenylene ether resin (c) is performed in the presence of a radical initiator, a catalyst, or a radical initiator and a catalyst.

7. The thermosetting resin composition of claim 1, wherein the cross-linking curing agent (d) is one or more selected from the group consisting of divinyl benzene, divinyl naphthalene, divinyl phenyl, triallyl isocyanurate, triallyl cyanurate, 1,2,4-trivinyl cyclohexane, 1,7-octadiene, and 1,9-decadiene.

8. The thermosetting resin composition of claim 1, wherein a ratio of the bisphenol M-type epoxy resin (a) and the bisphenol M-type cyanate resin (b) used is in a weight ratio range of 1:1 to 1.6.

9. The thermosetting resin composition of claim 1, wherein the thermosetting resin composition comprises:
   (a) 5 to 25 parts by weight of the bisphenol M-type epoxy resin;
   (b) 5 to 35 parts by weight of the bisphenol M-type cyanate ester resin;

(c) 35 to 70 parts by weight of the polyphenylene ether resin having two or more vinyl groups on the side chain in the molecule; and (d) 5 to 30 parts by weight of the cross-linking curing agent.

10. The thermosetting resin composition of claim 1, which further comprises:

one or more flame retardants selected from the group consisting of a halogen-containing flame retardant, a phosphorus-based flame retardant, an antimony-based flame retardant, and a metal hydroxide.

11. The thermosetting resin composition of claim 1, which further comprises:

an inorganic filler.

12. The thermosetting resin composition of claim 1, wherein the thermosetting resin composition has a semi-interpenetrating network (semi-IPN) structure comprising a repeating unit derived from (a) the bisphenol M-type epoxy resin; (b) the bisphenol M-type cyanate ester resin; (c) the polyphenylene ether having two or more vinyl groups at both ends of a molecular chain or oligomers thereof; and (d) the cross-linking curing agent.

13. A prepreg comprising:

a fibrous substrate; and the thermosetting resin composition of claim 1 impregnated in the fiber substrate.

14. The prepreg of claim 13, wherein the fibrous substrate comprises one or more selected from the group consisting of glass fiber, glass paper, glass web, glass cloth, aramid fiber, aramid paper, polyester fiber, carbon fiber, inorganic fiber, and organic fiber.

15. A functional laminate sheet comprising:

a metal foil or a polymer film substrate; and a resin layer formed on one surface or both surfaces of the substrate, in which the thermosetting resin composition of claim 1 is cured.

16. A printed circuit board laminated and molded by comprising one or more layers of the prepreg of claim 13.

\* \* \* \* \*